US009659137B2

(12) United States Patent
Lee

(10) Patent No.: US 9,659,137 B2
(45) Date of Patent: May 23, 2017

(54) METHOD OF VERIFYING LAYOUT OF MASK ROM

(71) Applicant: SAMSUNG ELECTRONICS CO., LTD., Suwon-si, Gyeonggi-do (KR)

(72) Inventor: Chan-Ho Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 78 days.

(21) Appl. No.: 14/591,439

(22) Filed: Jan. 7, 2015

(65) Prior Publication Data

US 2015/0234977 A1  Aug. 20, 2015

Related U.S. Application Data

(60) Provisional application No. 61/941,243, filed on Feb. 18, 2014.

(30) Foreign Application Priority Data

Jul. 25, 2014 (KR) ........................ 10-2014-0095006

(51) Int. Cl.
*G06F 17/50* (2006.01)
*G06F 11/22* (2006.01)
*G06F 13/12* (2006.01)
*G06F 11/10* (2006.01)
*G06F 11/27* (2006.01)
*G06F 12/06* (2006.01)

(52) U.S. Cl.
CPC ...... *G06F 17/5081* (2013.01); *G06F 11/1068* (2013.01); *G06F 11/2205* (2013.01); *G06F 11/27* (2013.01); *G06F 12/06* (2013.01); *G06F 13/124* (2013.01); *G06F 17/5068* (2013.01)

(58) Field of Classification Search
CPC ............. G06F 17/5081; G06F 17/5068; G06F 11/1068; G06F 12/06; G06F 11/2205; G06F 11/27; G06F 8/665; H01L 2924/14; H01L 23/544

See application file for complete search history.

(56) References Cited

U.S. PATENT DOCUMENTS

| 5,091,908 A * | 2/1992 | Zorian ............... G11C 29/40 714/722 |
| 5,140,597 A * | 8/1992 | Araki ............... G06F 11/1008 365/200 |
| 5,332,917 A * | 7/1994 | Lee .................. H01L 27/112 257/390 |
| 5,514,611 A * | 5/1996 | Kim ................. H01L 29/7836 257/E27.102 |
| 5,522,076 A * | 5/1996 | Dewa ................. G06F 9/4406 713/2 |
| 5,959,912 A * | 9/1999 | Powell ............... G01R 31/30 365/201 |

(Continued)

*Primary Examiner* — Helen Rossoshek
(74) *Attorney, Agent, or Firm* — F. Chau & Associates, LLC

(57) ABSTRACT

A method of verifying a layout of a mask read only memory (ROM) includes: receiving source ROM code, bitmap data, and layout design data of the mask ROM; generating coordinate data of a bit determining unit based on the layout design data; and determining an error cell based on the coordinate data of the bit determining unit, the bitmap data, and the source ROM code.

10 Claims, 11 Drawing Sheets

(56) References Cited

U.S. PATENT DOCUMENTS

| | | | | |
|---|---|---|---|---|
| 5,961,653 A * | 10/1999 | Kalter | G06F 11/2635 | 714/30 |
| 6,198,663 B1 * | 3/2001 | Takizawa | G06F 11/24 | 365/185.29 |
| 6,252,817 B1 * | 6/2001 | Seo | G11C 8/12 | 365/230.03 |
| 6,263,477 B1 * | 7/2001 | Kobayashi | G11C 5/04 | 365/218 |
| 6,324,673 B1 * | 11/2001 | Luo | G06F 17/5081 | 438/17 |
| 6,691,301 B2 * | 2/2004 | Bowen | G06F 17/5045 | 712/15 |
| 7,024,640 B2 | 4/2006 | Buchanan | | |
| 7,064,579 B2 * | 6/2006 | Madurawe | H01L 27/105 | 257/202 |
| 7,185,295 B2 * | 2/2007 | Park | G01B 31/318357 | 714/E11.168 |
| 7,305,638 B1 * | 12/2007 | Stine | G11C 17/12 | 703/28 |
| 7,382,640 B2 * | 6/2008 | Lee | G11C 17/126 | 365/94 |
| 7,539,832 B2 | 5/2009 | Silva et al. | | |
| 7,873,754 B2 | 1/2011 | Bircher et al. | | |
| 8,060,843 B2 | 11/2011 | Wang et al. | | |
| 8,296,705 B2 | 10/2012 | Yang | | |
| 8,372,742 B2 | 2/2013 | Cheng et al. | | |
| 8,453,073 B1 | 5/2013 | Dwivedi et al. | | |
| 8,671,367 B2 | 3/2014 | Wang et al. | | |
| 8,701,077 B1 * | 4/2014 | Lemsitzer | G11C 8/20 | 716/111 |
| 8,874,837 B2 * | 10/2014 | Neely | H03K 19/17732 | 711/103 |
| 2002/0015898 A1 * | 2/2002 | Sung | H01L 23/544 | 430/5 |
| 2004/0003006 A1 * | 1/2004 | Kanazawa | G06F 17/5081 | |
| 2004/0212395 A1 * | 10/2004 | Madurawe | H03K 19/1735 | 326/39 |
| 2006/0052962 A1 * | 3/2006 | Shipton | B41J 2/04505 | 702/106 |
| 2007/0143650 A1 * | 6/2007 | Chhabra | G11C 29/10 | 714/718 |
| 2007/0192631 A1 * | 8/2007 | Anderson | G06F 21/78 | 713/193 |
| 2008/0201620 A1 * | 8/2008 | Gollub | G06F 11/1044 | 714/718 |
| 2010/0039847 A1 * | 2/2010 | Yano | H01L 23/49575 | 365/51 |
| 2010/0174955 A1 * | 7/2010 | Carnevale | G11O 5/04 | 714/718 |
| 2010/0299567 A1 * | 11/2010 | Hapke | G01R 31/318547 | 714/726 |
| 2011/0188071 A1 * | 8/2011 | Yoshida | G06F 3/03545 | 358/1.15 |
| 2011/0211748 A1 * | 9/2011 | Xiao | G06K 9/036 | 382/144 |
| 2011/0283054 A1 * | 11/2011 | Kozakai | G06F 11/1068 | 711/103 |
| 2012/0017184 A1 | 1/2012 | Tsukamoto et al. | | |
| 2012/0140560 A1 * | 6/2012 | Yang | G11C 11/5642 | 365/185.18 |
| 2013/0151914 A1 * | 6/2013 | Cadigan | G06F 11/1068 | 714/723 |
| 2014/0001564 A1 | 1/2014 | Song et al. | | |
| 2014/0192583 A1 * | 7/2014 | Rajan | G11C 7/10 | 365/63 |
| 2014/0359383 A1 * | 12/2014 | Rodriguez | G11C 29/30 | 714/718 |
| 2015/0227671 A1 * | 8/2015 | Yu | G06F 17/5081 | 716/52 |
| 2015/0269034 A1 * | 9/2015 | Zhang | G11C 29/08 | 714/19 |
| 2015/0356294 A1 * | 12/2015 | Tan | G06F 8/427 | 726/22 |

\* cited by examiner

FIG. 6

```
                                    ,14
#address      bit[0]        bit[1]        bit[2]
00000         0.76,9.76     2.70,9.87     24.01,9.76
00001         1.00,9.76     2.94,9.76     24.14,9.87
00002         1.24,9.76     3.18,9.76     24.39,9.76
00003         1.49,9.87     3.42,9.87     24.73,9.76
00004         1.83,9.76     3.66,9.76     24.87,9.87
  :             :             :             :
  :             :             :             :
```

METHOD OF VERIFYING LAYOUT OF MASK ROM

CROSS-REFERENCE TO RELATED APPLICATIONS

This application claims priority to U.S. Provisional Application No. 61/941,243, filed on Feb. 18, 2014, and priority to Korean Patent Application No. 10-2014-0095006, filed on Jul. 25, 2014, in the Korean Intellectual Property Office, the disclosures of which are incorporated by reference in their entirety herein.

BACKGROUND

The inventive concept relates to a read only memory (ROM) of a semiconductor memory, and more particularly, to verification of a layout of a mask ROM.

ROM is a memory that stores data in a non-volatile manner. The ROM is capable of retaining its stored contents even in the absence of supplied power. Data stored in a mask ROM may be programmed by a semiconductor manufacturer. For example, the mask ROM may store data by forming a previously determined circuit pattern on a semiconductor. The previously determined circuit pattern may be formed by using a photo mask manufactured corresponding to data that is to be stored in the mask ROM.

The mask ROM is included in various semiconductor devices. For example, a micro-processor may include the mask ROM to store a micro-code, and a micro-controller may include the mask ROM to store a boot loader or firmware, etc. However, due to the cost incurred to manufacture the photo mask for forming the circuit pattern, the mask ROM may entail enormous cost at an initial production stage and need a long turnaround time (TAT) from designing to production. When an error occurs in the mask ROM or data (i.e., in the ROM code) stored in the mask ROM, it may be expensive to correct the error.

SUMMARY

At least one embodiment of the inventive concept provides a method of verifying a layout of a mask read only memory (ROM), and more particularly, a method of verifying whether the layout of the mask ROM complies with ROM code at a high speed and a method of generating a hardwired ROM code from the layout of the mask ROM.

According to an exemplary embodiment of the inventive concept, there is provided a method of verifying a layout of a mask read only memory (ROM), the method including: receiving source ROM code, bitmap data, and layout design data of the mask ROM; generating coordinate data of a bit determining unit based on the layout design data; and determining an error cell based on the coordinate data of the bit determining unit, the bitmap data, and the source ROM code.

The generating of the coordinate data of the bit determining unit may include: extracting geometric data with respect to at least one layer relating to the bit determining unit from the layout design data based on a type of the bit determining unit.

The generating of the coordinate data of the bit determining unit may include: determining an area of a cell array based on the bitmap data; and generating coordinate data of a bit determining unit included in the area of the cell array.

The extracting of the geometric data with respect to the at least one layer may include: receiving a design rule file generated such that design rule check (DRC) result data includes the geometric data with respect to the at least one layer; and providing the design rule file to an input of the DRC.

The determining of the error cell may include: determining whether a cell corresponding to a first address is an on-cell or an off-cell based on the bitmap data and the coordinate data of the bit determining unit; and comparing a bit value corresponding to the first address with a result of the determining between the on-cell and the off-cell.

The determining of the error cell may include: generating hardwired ROM code based on the bitmap data and the coordinate data of the bit determining unit; and comparing the hardwired ROM code with the source ROM code.

The method may further include: outputting coordinate data of the error cell according to a result of the determining of the error cell.

The bitmap data may include coordinate data of a cell and address information corresponding to the cells.

The layout design data may have a graphic data system II (GDSII) format.

The bit determining unit may include one of a via, metal, a diffusion area, an injection area, a contact, or a part thereof.

According to an exemplary embodiment of the inventive concept, there is provided a non-transitory computer-readable recording medium having recorded thereon a computer program for executing the method.

According to an exemplary embodiment of the inventive concept, there is provided a method of verifying a layout of a mask read only memory (ROM), the method including: receiving bitmap data and layout design data of the mask ROM; generating coordinate data of a bit determining unit based on the layout design data; and generating hardwired ROM code of the mask ROM based on the coordinate data of the bit determining unit and the bitmap data.

The generating of the coordinate data of the bit determining unit may include: extracting geometric data with respect to at least one layer relating to the bit determining unit from the layout design data based on a type of the bit determining unit.

The generating of the coordinate data of the bit determining unit may include: determining an area of a cell array based on the bitmap data; and generating coordinate data of a bit determining unit included in the area of the cell array.

The extracting of the geometric data with respect to the at least one layer may include: receiving a design rule file generated such that design rule check (DRC) result data includes the geometric data with respect to the at least one layer; and providing the design rule file to an input of the DRC.

The method may further include: receiving source ROM code of the mask ROM; comparing the hardwired ROM code with the source ROM code; and outputting coordinate data of the error cell based on a result of the comparison and the bitmap data.

According to an exemplary embodiment of the inventive concept, there is provided a computer system including: a processor; and a non-transitory computer-readable recording medium having recorded thereon a plurality of commands performed by the processor so as to perform a method of verifying a layout of a mask read only memory (ROM), wherein the method includes: receiving source ROM code, bitmap data, and layout design data of the mask ROM; generating coordinate data of a bit determining unit based on the layout design data; and determining an error cell based on the coordinate data of the bit determining unit, the bitmap data, and the source ROM code.

According to an exemplary embodiment of the inventive concept, a method of verifying a layout of a mask read only memory (ROM) is provided. The method includes: identifying a cell within layout design data of the mask ROM from coordinate data within bitmap data of the mask ROM; determining whether a current type of the identified cell is an on-cell or an off-cell; determining from ROM source code for the mask ROM whether an intended type of the identified cell is the on-cell or the off-cell; and determining the identified cell to have an error if the current type does not match the intended type.

In an exemplary embodiment, the identified cell is an object within the layout design data with a location that matches a location of a bit in the bitmap data. In an exemplary embodiment, the determining of the current type includes: determining of the current type to be the on-cell when a via is present in the identified cell; and determining of the current type to be the off-cell when the via is not present in the identified cell. In an exemplary embodiment, the determining of the current type includes: determining of the current type to be the off-cell when two vias are present adjacent in a same direction in the identified cell; and determining the current type to be the on-cell when the two vias are not present in the same direction in the identified cell. In an exemplary embodiment, when the identified cell is determined to have the error, the method includes: adding a via to the identified cell or moving a via in the identified cell, in the layout design data, if the intended type is the on-cell; and removing a via from the identified cell or moving a via in the identified cell, if the intended type is the off-cell.

BRIEF DESCRIPTION OF THE DRAWINGS

Exemplary embodiments of the inventive concept will be more clearly understood from the following detailed description taken in conjunction with the accompanying drawings in which:

FIG. 6 is a diagram of an example of bitmap data;

DETAILED DESCRIPTION

Figure 1:
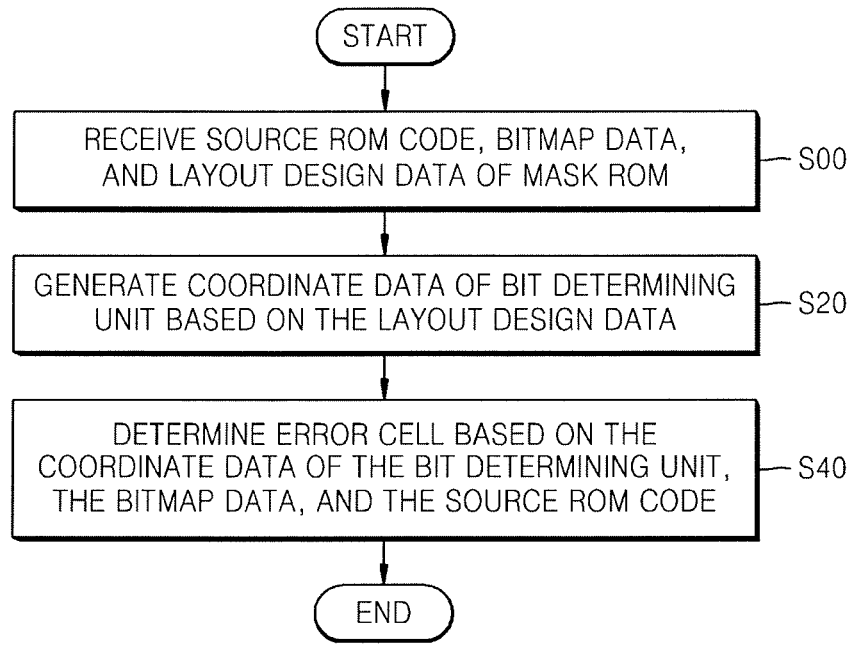
FIG. 1 is a flowchart of a method of verifying a layout of a mask read only memory (ROM), according to an exemplary embodiment of the inventive concept.

The present inventive concept will now be described more fully hereinafter with reference to the accompanying drawings, in which exemplary embodiments of the inventive concept are shown. These embodiments are provided so that this disclosure is thorough and complete and fully conveys the scope of the inventive concept to one skilled in the art. While specific embodiments of the inventive concept are shown in the drawings and described in detail below as examples, the inventive concept can be modified in various ways and take on various alternative forms. The inventive concept is intended to cover all modifications, equivalents, and alternatives falling within the spirit and scope of the disclosure. Like reference numerals refer to like elements throughout. In the drawings, the thicknesses of layers and regions may be exaggerated for clarity. As used herein, the singular forms "a", "an", and "the" are intended to include the plural forms as well, unless the context clearly indicates otherwise.

FIG. 1 is a flowchart of a method of verifying a layout of a mask read only memory (ROM), according to an exemplary embodiment of the inventive concept. During a process of manufacturing a semiconductor device including the mask ROM, a process of verifying whether layout design data for manufacturing the mask ROM complies with a ROM code (hereinafter, referred to as source ROM code) that is to be programmed into the mask ROM may be required. When the mask ROM or a semiconductor device including the mask ROM is changed by a customer often or manufacturing of a new semiconductor device including the mask ROM starts, it is very important to determine whether the layout design data of the mask ROM complies with the source ROM code. In addition to the accuracy of verification, there is a need to verify a layout of the mask ROM at a high speed so as to reduce a turnaround time (TAT) with respect to the mask ROM.

As shown in FIG. 1, the method of verifying the layout of the mask ROM, according to an exemplary embodiment of the inventive concept, includes receiving the source ROM code, bitmap data, and the layout design data (S00). The source ROM code may refer to data that is to be programmed into the mask ROM, and may be, for example, code provided by the customer or a result obtained by compiling the code. The bitmap data may include coordinate data of each cell corresponding to an address input to the mask ROM in a cell array included in the mask ROM. That is, the bitmap data may include coordinate data of a cell and address information corresponding to the cell. For example, the bitmap data may indicate a position of each cell within the cell array and an address that needs to be applied to address input pins of the mask ROM to access the corresponding cell. The layout design data may include geometric data defining a structure implemented by using a semiconductor material, metal, an insulator, etc. and may have, for example, a graphic data system II (GDSII) format. The layout design data may be in a binary file format representing planar geometric shapes, text labels, and other information about the layout in a hierarchical form.

The method of verifying the layout of the mask ROM, according to an exemplary embodiment of the inventive concept, receives the source ROM code, the bitmap data, and the layout design data, and verifies the layout of the mask ROM based on the source ROM code, the bitmap data, and the layout design data. That is, the method of verifying the layout of the mask ROM, according to an exemplary embodiment of the inventive concept, does not include a simulation process like a simulation program with integrated circuit emphasis SPICE performed by using circuit design data of the mask ROM such as a circuit design language (CDL). Accordingly, the method according to an exemplary embodiment of the inventive concept may dramatically reduce the time taken to verify the layout of the mask ROM while maintaining the accuracy of verification. An experiment result shows that a method of using the simulation process takes 2 weeks, whereas the method according to an embodiment of the inventive concept takes tens of seconds through several minutes.

The method of verifying the layout of the mask ROM, according to an exemplary embodiment of the inventive concept, generates coordinate data of a bit determining unit based on the layout design data (operation S20). The bit determining unit may refer to an object that includes at least one type of material and has volume on a semiconductor substrate. As will be described later, a cell that stores one or more bits (or bit data) in the mask ROM may store one or more bits having different values according to whether bit determining units are present or according to an arrangement of the bit determining units. The method of verifying the layout of the mask ROM, according to an exemplary embodiment of the inventive concept, may generate coordinate data of bit determining units in a cell array including a plurality of cells.

The method of verifying the layout of the mask ROM, according to an exemplary embodiment of the inventive concept, may determine an error cell based on the coordinate data of the bit determining unit, the bitmap data, and the layout design data (S40). When a cell is accessed by the address input to the mask ROM, the error cell may refer to a cell configured to store a bit corresponding to an address and other bits in the source ROM code. A designer or a semiconductor design tool may correct the error cell in the layout design data based on coordinate data of the error cell determined according to an exemplary embodiment of the inventive concept.

Figure 2:
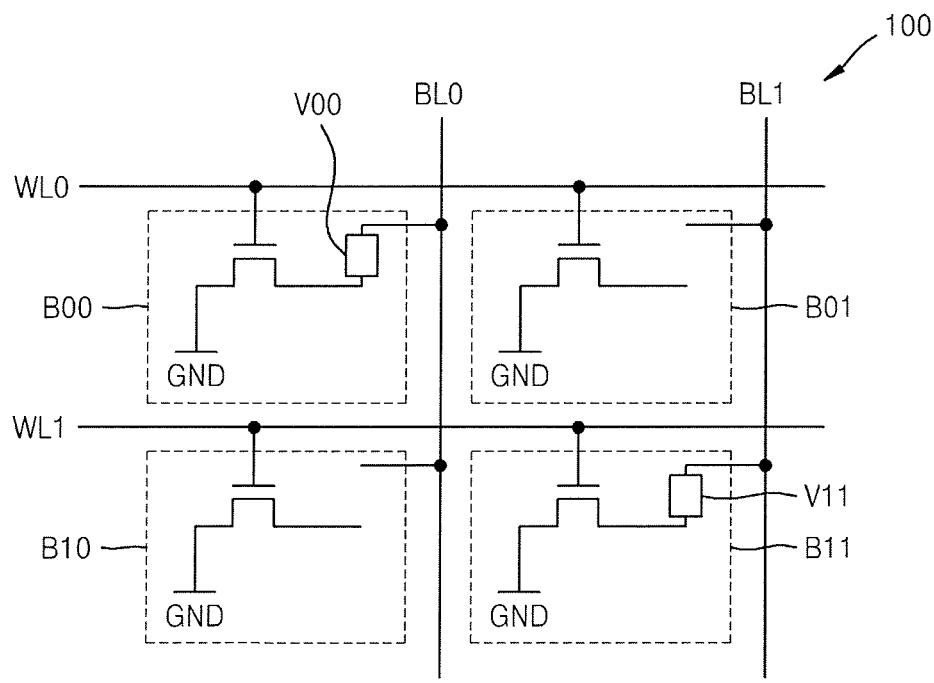
FIG. 2 is a schematic diagram of a structure of a cell array included in a mask ROM.

FIG. 2 is a schematic diagram of a structure of a cell array 100 included in a mask ROM. As shown in FIG. 2, the cell array 100 may include a plurality of cells B00 through B11. Each of the cells B00 through B11 may be connected to a word line WL0 or WL1 and may include a transistor having a gate connected to the word line WL0 or WL1 and a source to which a ground voltage GND is applied. Each of the cells B00 through B11 may selectively include a via V00 or V11. The transistor of the cells B00 through B11 including the via V00 or V11 may be connected to a bit line BL0 or BL1 through the via V00 or V11.

Each of the cells B00 through B11 may store bits according to whether the via V00 or V11 is present in FIG. 2. For example, each of the bit lines BL0 and BL1 may be connected to a pull-up resistance connected to a power voltage. The transistor of the cell B00 may be connected to the bit line BL0 through the via V00. When the word line WL0 is activated, a voltage of the bit line BL0 may be approximately the ground voltage GND received through the transistor and the via V00 that are included in the cell B00. The cell B01 does not include a via, and thus the transistor included in the cell B01 is not connected to the bit line BL1. As a result, irrespective of whether the word line WL0 is activated, the bit line BL1 may approximately maintain the power voltage by the pull-up resistance. A circuit (for example, a sense amplifier) connected to the bit lines BL0 and BL1 may detect voltages of the bit lines BL0 and BL1 when the word line WL is activated and detect data stored in the cells B00 and B01 connected to the activated word line WL0.

FIG. 2 is merely an example. The method of verifying the layout of the mask ROM, according to an exemplary embodiment of the inventive concept, is not limited to the structure of the cell array 100 of FIG. 2. The method of verifying the layout of the mask ROM, according to an exemplary embodiment of the inventive concept, may be used in the mask ROM that has a structure storing bits according to an arrangement of bit determining units (for example, vias) included in a cell as shown in FIG. 4, as well as a mask ROM of another structure.

Figure 3:
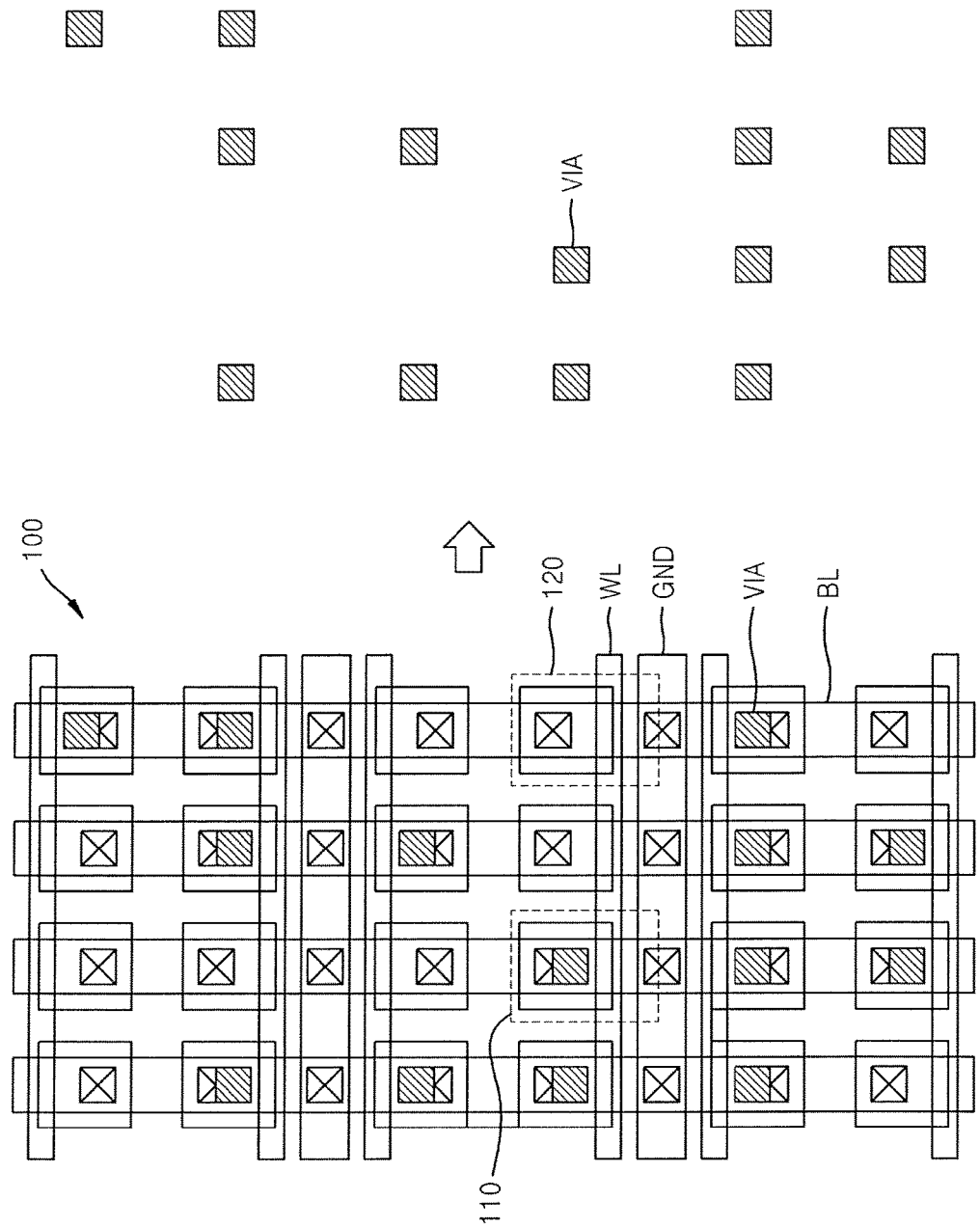
FIGS. 3 and 4 are diagrams for explaining an operation of generating a coordinate of a bit determining unit from layout design data, according to an exemplary embodiment of the inventive concept.
Figure 4:
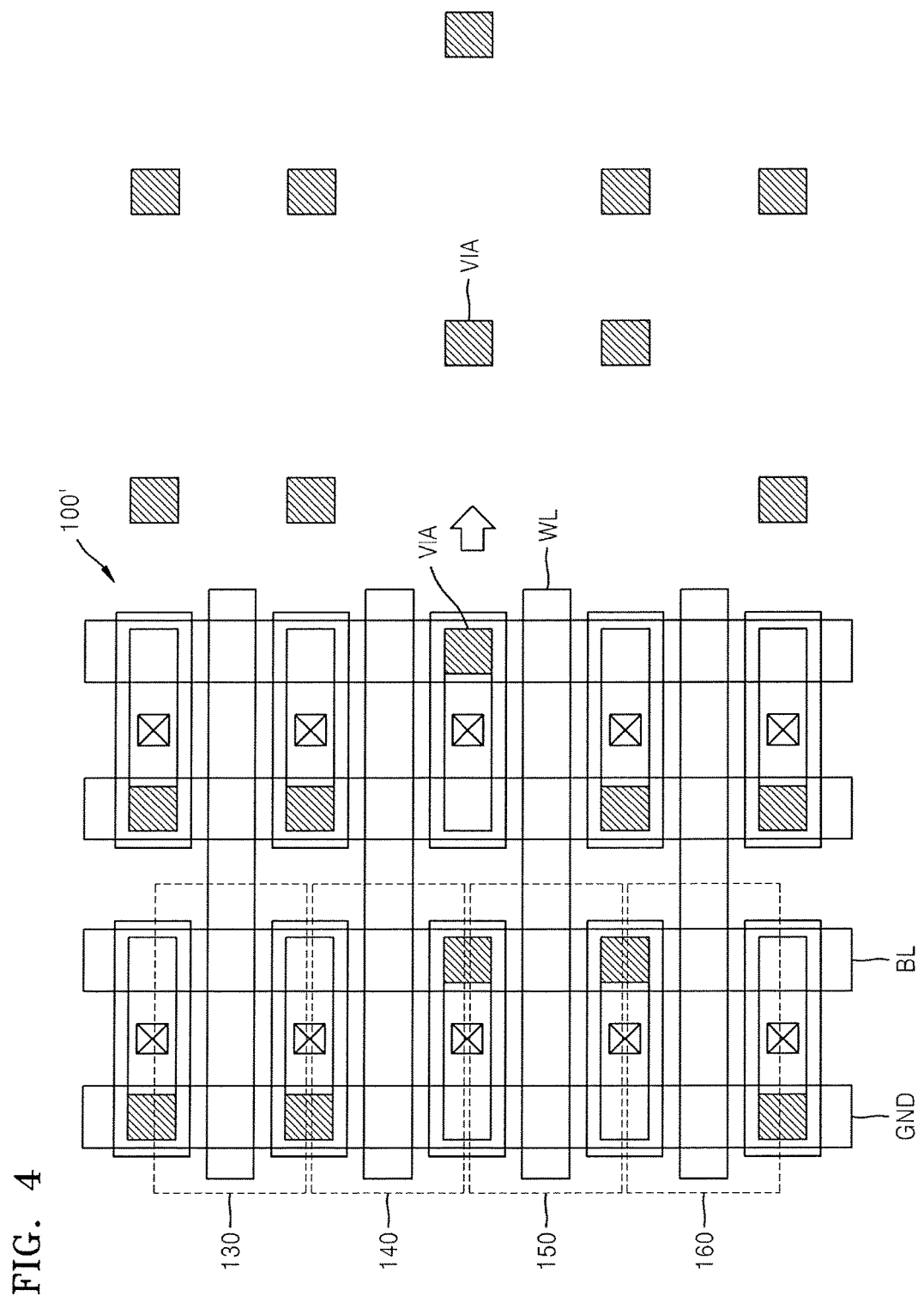

FIGS. 3 and 4 are diagrams for explaining an operation of generating a coordinate of a bit determining unit (e.g., a via) from layout design data according to an exemplary embodiment of the inventive concept. In more detail, FIG. 3 shows a cell array of a mask ROM including cells that include or do not include the bit determining unit according to a bit value, and FIG. 4 shows a cell array of a mask ROM including cells that change an arrangement of bit determining units according to the bit value. A semiconductor design tool may include a memory generator that receives parameters relating to a structure of the mask ROM and source ROM code and generates layout design data of the mask ROM based on a cell library. The mask ROM may include the cell array including a plurality of cells, a driver for accessing each of the cells, a sense amplifier that detects signals that are output from the cells, a register, etc.

As described above, the cells of the mask ROM may store bits according to whether bit determining units are present or according to an arrangement of the bit determining units. The bit determining unit refers to an object including at least one type of material and having volume on a semiconductor substrate, and may include, for example, one selected from the group consisting of a via, metal, a diffusion area, an injection area, a contact, a wire, or a part thereof. For example, the bit determining unit may be the via in the examples of FIGS. 3 and 4.

Referring to FIG. 3, as shown on the left of FIG. 3, a layout of the cell array 100 may include a stack structure of a plurality of layers. That is, the layout of the cell array 100 may include a stack structure of a plurality of layers on which a transistor, a word line WL, a bit line BL, a ground line GND, etc. are formed. According to an exemplary embodiment of the inventive concept, geometric data with respect to at least one of the layers relating to a bit determining unit may be extracted from the layout design data, based on a type of the bit determining unit used to store bits. In an exemplary embodiment, only the geometric data with respect to the layer relating to the bit determining unit is extracted from the layout design data. The coordinate data of the bit determining unit may be generated by using the extracted geometric data. Only the geometric data with respect to some of the whole layers is used, thereby reducing the amount of operations that generate the coordinate data of the bit determining unit, and thus the coordinate data of the bit determining unit may be generated at a high speed. For example, if the stack structure includes three layers, the geometric data of one of the three layers could be extracted while the geometric data of the remaining two layers could be ignored.

As shown in the left of FIG. 3, the cell array 100 may include a plurality of word lines WL and ground lines GND that extend in a horizontal direction, and a plurality of bit lines BL that extend in a vertical direction. The cell array 100 may include a plurality of transistors having sources connected to the ground lines GND and gates forming the word lines WL. As described with respect to FIG. 2 above, the transistors may be selectively connected to the bit lines BL via the via VIA. For example, as shown in FIG. 3, a cell 110 may include the via VIA, and a transistor included in the cell 110 may be connected to the bit line BL through the via VIA. For example, in FIG. 3, a shape illustrated with a hatched or shaded square may refer to a via VIA. A cell 120 does not include the via VIA, and a transistor included in the cell 120 is not connected to the bit line BL. A cell including the via VIA, such as the cell 110, may refer to an on-cell. A cell not including the via VIA, such as the cell 120, may refer to an off-cell. That is, the on-cell may refer to a cell that changes a voltage of the bit line BL according to whether the word line WL is activated, and the off-cell may refer to a cell that does not change the voltage of the bit line BL irrespective of whether the word line WL is activated. The on-cell and the off-cell may respectively store "0" and "1" or "1" and "0". The on-cell and the off-cell respectively store "1" and "0" in the description below.

According to an exemplary embodiment of the inventive concept, the geometric data with respect to at least one of the layers relating to a bit determining unit (e.g., a via) is extracted from the layout design data. For example, geometric data of a layer corresponding to the via VIA on the right of FIG. 3 is extracted from layout design data including a plurality of layouts on the left of FIG. 3. For example, the layer corresponding to the via VIA may be a layer disposed between metal layers (for example, M1 and M2). For example, the geometric data of only the vias in a single layer can be extracted. For example, the geometric data may indicate the number of vias present in the layer and their locations within the layer.

Referring to FIG. 4, as shown on the left of FIG. 4, a layout of a cell array 100' may include a stack structure of a plurality of layers. In more detail, the cell array 100' may include word lines WL that extend in a horizontal direction, and ground lines GND and bit lines BL that extend in a vertical direction and are alternately disposed. The cell array 100' may include a plurality of transistors having gates forming the word lines WL. Each of cells 130 through 160 may store bits according to an arrangement of 2 vias VIA in FIG. 4. For example, a source and a drain of a transistor included in the cell 130 may be connected to the ground line GND through the 2 vias VIA that are partially included in the cell 130. One of a source and a drain of a transistor included in the cell 140 may be connected to the ground line GND through the via VIA, and the other may be connected to the bit line BL through the via VIA. A cell such as the cell 130 may refer to an off-cell. A cell such as the cell 140 may refer to an on-cell. Similarly, the cell 150 may refer to the off-cell, and the cell 160 may refer to the on-cell.

A transistor included in the off-cell, such as the cell 130 or 150, does not electrically connect the ground line GND to the bit line BL even when the word line WL is activated. A transistor included in the on-cell, such as the cell 140 or 160, electrically connects the ground line GND to the bit line BL when the word line WL is activated. Accordingly, a voltage of the bit line BL that is pulled-up to a power voltage by a pull-up resistance may be maintained or changed according to an arrangement of the 2 vias VIA included in a cell connected to the activated word line WL.

According to an exemplary embodiment of the inventive concept, geometric data of a layer corresponding to the via VIA on the right of FIG. 4 is extracted from layout design data including a plurality of layouts on the left of FIG. 4. For example, the layer corresponding to the via VIA may be a layer disposed between metal layers (for example, M1 and M2). In exemplary embodiment, the number of vias VIA extracted from the cell array 100 of FIG. 3 is related to source ROM code. In an exemplary embodiment, the number of vias VIA extracted from the cell array 100' of FIG. 4 is approximately identical to the number of cells included in the cell array 100'.

Figure 5:
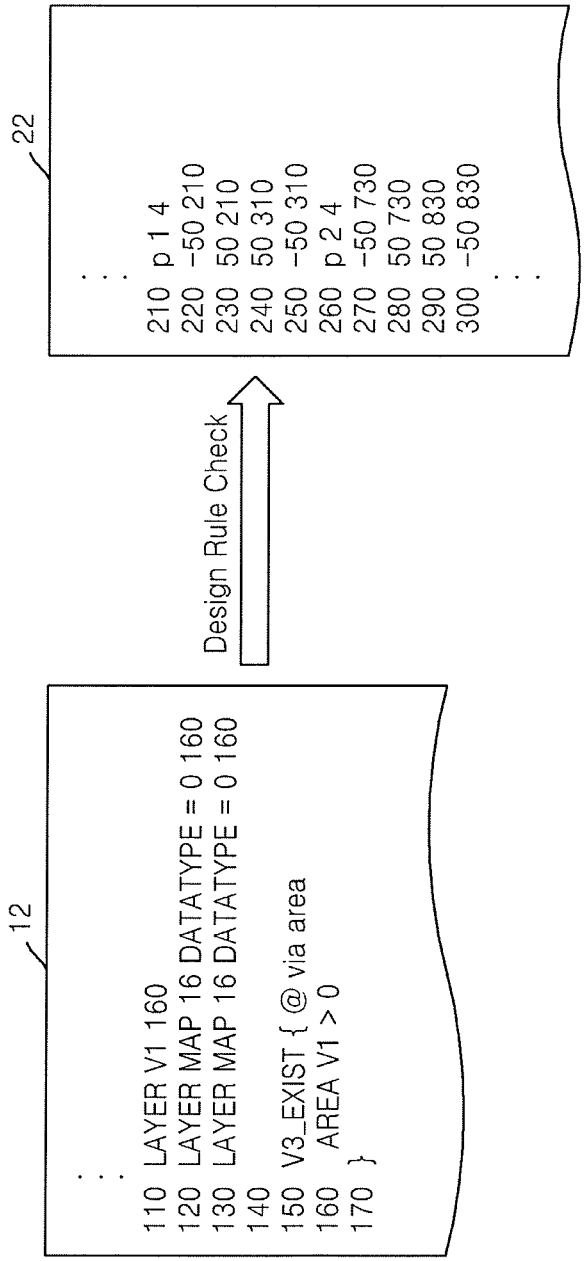
FIG. 5 is a diagram for explaining an exemplary operation of extracting coordinate data of a bit determining unit from layout design data, according to an exemplary embodiment of the inventive concept.

FIG. 5 is a diagram for explaining an exemplary operation of extracting coordinate data of a bit determining unit (e.g., a via) from layout design data, according to an exemplary embodiment of the inventive concept. An operation of extracting geometric data with respect to at least one layer from the layout design data may be performed by using a design rule check (DRC), according to an exemplary embodiment of the inventive concept. The DRC is used to determine whether the layout design data meets a design rule. For example, the design rule may define a minimum width in an arbitrary shape and a minimum distance between two adjacent objects. The width and/or distance may be determined according to a semiconductor manufacturing process and may be differently defined according to each layer. A file defining the design rule is called a design rule file or a run set file, and usually provides the DRC determining whether the layout design data meets the design rule based on the design rule file. After performing the DRC, DRC result data regarding location information of a part that does not meet the design rule and an error may be generated.

An operation of extracting geometric data with respect to at least one layout from the layout design data according to an exemplary embodiment of the inventive concept is performed by performing the DRC using an appropriately prepared design rule file. For example, as shown on the left of FIG. 5, a design rule file 12 generated such that the DRC result data 22 includes the geometric data with respect to the at least one layout may be received. The design rule file 12 may be prepared by a user or automatically by using a semiconductor design tool.

For example, as shown in FIG. 5, the design rule file 12 includes extraction of geometric information regarding a layer "VI" relating to a via (lines 150 through 170). That is, referring to FIGS. 3 and 4, the design rule file 12 may be prepared such that DRC result data 22 includes coordinate information of the via VIA and a coordinate of a part having area in the layer "VI" including the via VIA. The design rule file 12 may be provided to the semiconductor design tool that performs the DRC based on the design rule file 12 and generate the DRC result data 22. As shown in FIG. 5, the DRC result data 22 may include the coordinate information of the via VIA.

The DRC result data 22 may be used as the coordinate data of the bit determining unit. According to an exemplary embodiment of the inventive concept, the coordinate data of the bit determining unit is generated by processing the DRC result data 22. For example, the DRC result data 22 may include unnecessary information, for example, size information of the bit determining unit. The coordinate data of the bit determining unit may be generated by deleting the size information of the bit determining unit from the DRC result data 22.

Referring to FIG. 4, according to an exemplary embodiment of the inventive concept, the DRC result data 22 including the coordinate data of the bit determining unit (i.e.

the via VIA) generated from the cell array 100' that stores bits based on an arrangement of the bit determining unit may be processed in a similar manner to that of coordinate data of a main part generated from the cell array 100 of FIG. 3. That is, an on-cell or an off-cell may be determined based on the vias VIA that are adjacent in a vertical direction in the DRC result data 22 including coordinate data of the via VIA on the right of FIG. 4. For example, if the coordinate data of a cell of the cell array 100' indicates the presence of two vias adjacent in the same vertical direction, that cell is determined to be an off-cell, whereas if the coordinate data indicates the two vias are not arranged in the same vertical direction, that cell is determined to be an on-cell. Based on a determination result, a virtual via is selectively inserted into the cells 130 through 160, and thus coordinate data of the virtual via is generated, instead of the coordinate data of the via VIA on the right of FIG. 4.

FIG. 6 is a diagram of an example of bitmap data 14. The bitmap data 14 may include cell coordinate data corresponding to an address input into a mask ROM. That is, the bitmap data 14 may include data indicating a location of a cell corresponding to the address input to the mask ROM. For example, as shown in FIG. 6, a cell corresponding to a first bit (i.e., a least significant bit (LSB)) of data corresponding to an address "0002" input into the mask ROM may have a coordinate "1.24, 9.76", and a cell corresponding to a third bit of data corresponding to the address "0002" may have a coordinate "24.39, 9.76".

The bitmap data 14 may be generated simultaneously when a memory generator included in a semiconductor design tool generates layout design data based on a cell library. For example, an operation of verifying a layout of the mask ROM may be performed in a process of producing the mask ROM. In an exemplary embodiment, when an error cell is detected according to a verification result of the mask ROM, a layout of the error cell is corrected only when a location of the error cell needs to be known. To this end, the memory generator may generate the bitmap data 14. That is, a location of a cell corresponding to an address of a bit in which an error occurs may be determined based on the bitmap data 14 after determining the address of the bit. The bitmap data 14 may be generated for such a purpose. The method according to an exemplary embodiment of the inventive concept may determine the error cell by using the bitmap data 14.

Figure 7:
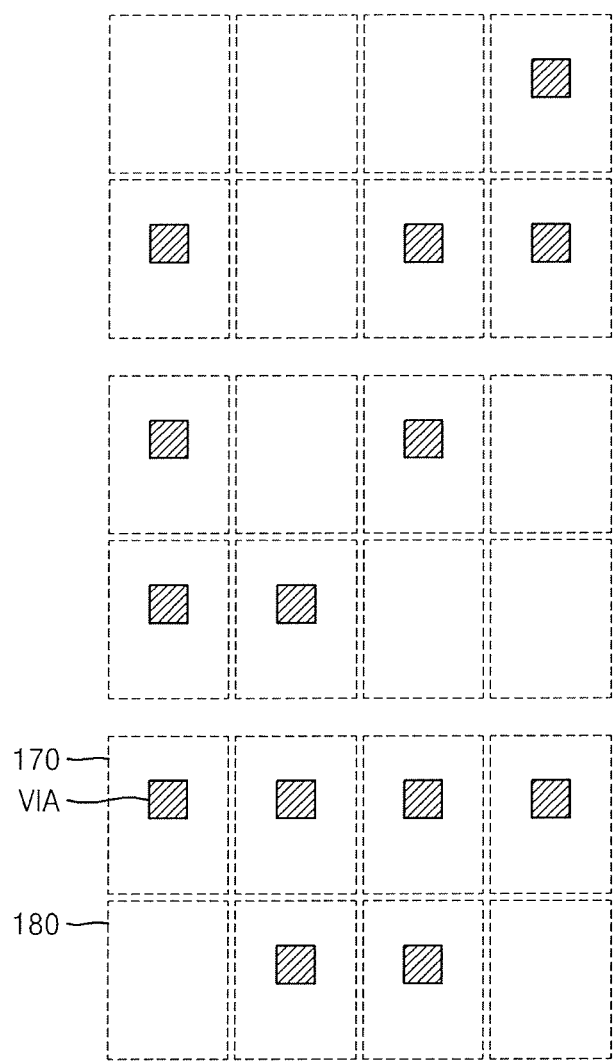
FIG. 7 is a diagram for explaining an operation of distinguishing on-cell or off-cell data, according to an exemplary embodiment of the inventive concept.

FIG. 7 is a diagram for explaining an operation of distinguishing on-cell or off-cell data, according to an exemplary embodiment of the inventive concept. The method of verifying a layout of a mask ROM, according to an exemplary embodiment of the inventive concept determines whether a cell corresponding to an address input is the on-cell or the off-cell based on coordinate data of a bit determining unit that is generated from layout design data and bitmap data. That is, the bitmap data includes address information corresponding to the cell and coordinate data of the cell, and thus the method according to an exemplary embodiment of the inventive concept determines whether the bit determining unit is included in the cell based on the coordinate data of the bit determining unit.

As shown in FIG. 7, since an address corresponding to each of the cells in a dashed line is recorded in the bitmap data, when the cell includes the bit determining unit based on the coordinate data (i.e. when the cell is the on-cell), an address input corresponding to the cell may be determined to access "1". For example, if a cell 170 includes the via VIA (i.e. when the cell 170 is the on-cell), a first address corresponding to the cell 170 may be determined to access "1". If a cell 180 does not include the via VIA (i.e. when the cell 180 is the off-cell), a second address corresponding to the cell 180 may be determined to access "0". As a result, a value of a bit corresponding to an address may be obtained from the layout design data and the bitmap data.

Figure 8:
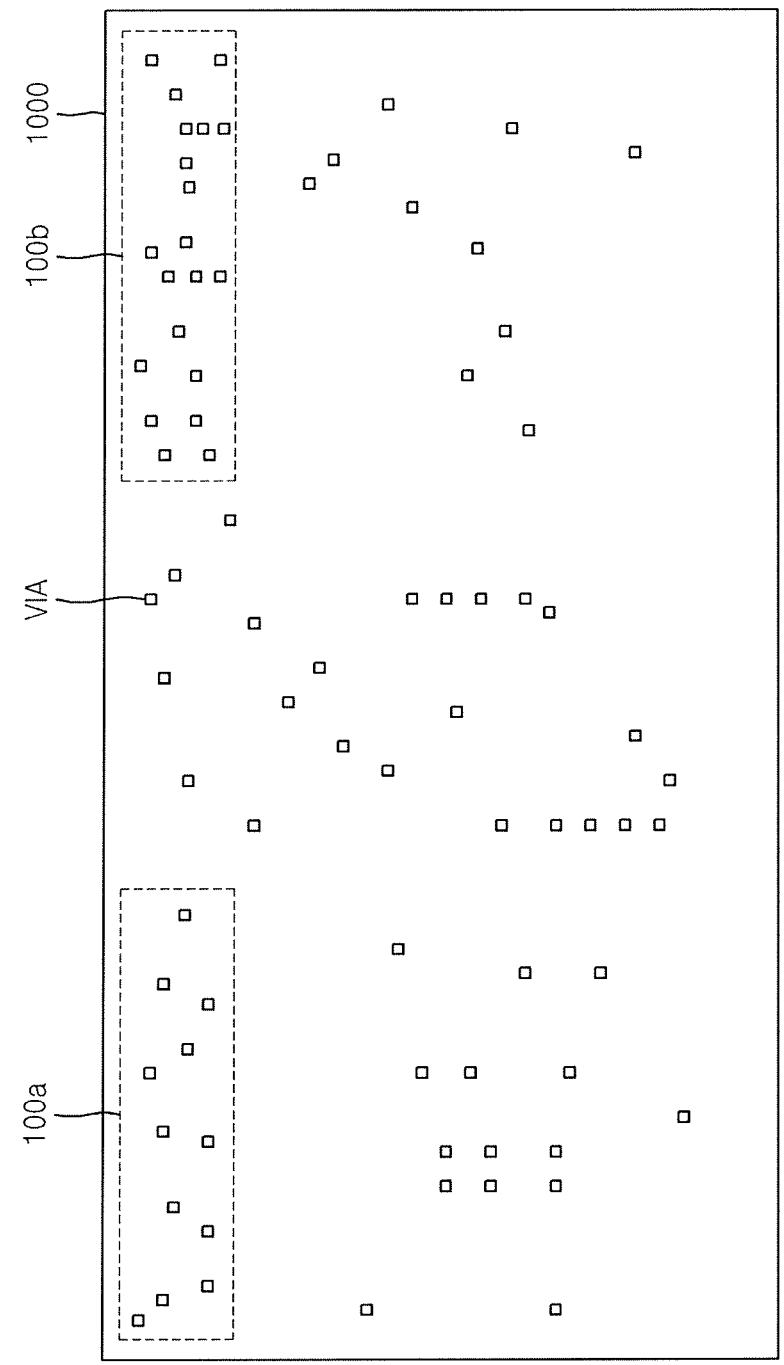
FIG. 8 is a diagram for explaining an operation of generating coordinate data of a bit determining unit, according to an exemplary embodiment of the inventive concept.

FIG. 8 is a diagram for explaining an operation of generating coordinate data of a bit determining unit, according to an exemplary embodiment of the inventive concept. As shown in FIG. 8, cell arrays 100a and 100b of a mask ROM may be included in a semiconductor device 1000. As described above, the mask ROM may include a driver for accessing each cell, a sense amplifier that detects a signal output from each cell, a register, etc. in addition to the cell arrays 100a and 100b. When the mask ROM is included in the semiconductor device 1000 such as a system-on-chip, the cell arrays 100a and 100b may have a relatively very small area in an entire layout of the semiconductor device 1000.

The method of verifying a layout of the mask ROM, according to an exemplary embodiment of the inventive concept includes an operation of determining an area of the cell arrays 100a and 100b based on bitmap data. Thereafter, the method according to an exemplary embodiment of the inventive concept includes an operation of generating coordinate data of a bit determining unit included in the area of the cell arrays 100a and 100b from geometric data with respect to at least one layer extracted from layout design data. A time taken to perform the operation of determining between the on-cell and the off-cell described with reference to FIG. 7 above may be reduced due to the reduced number of bit determining units.

Figure 9:
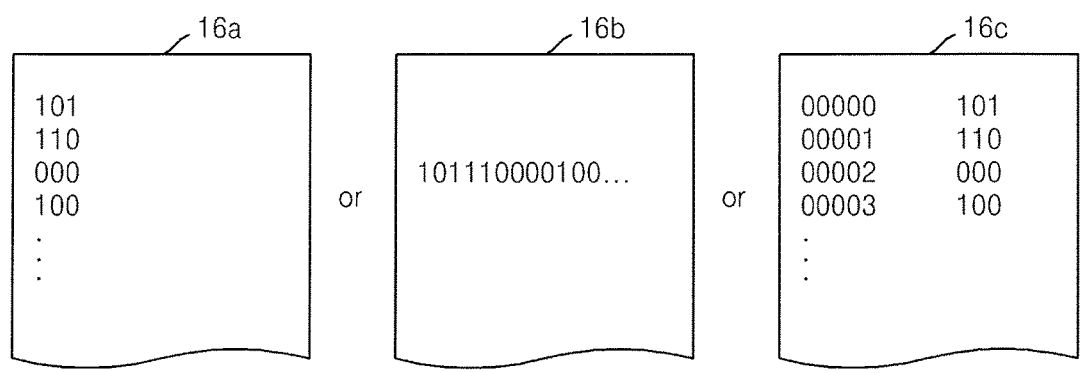
FIG. 9 is a diagram of examples of source ROM codes.

FIG. 9 is a diagram of examples of source ROM codes 16a, 16b, and 16c. The source ROM codes 16a, 16b, and 16c may refer to data that is to be programmed into a mask ROM and include a series of bits. As shown in FIG. 9, the source ROM codes 16a, 16b, and 16c may have various formats. For example, the source ROM code 16a has a format arranged according to an address and a data width (3 in this example). The source ROM code 16b has a format sequentially arranged irrespective of a data width. The source ROM code 16c is arranged according to an address and a data width and have a format including an address. The method of verifying a layout of a mask ROM, according to an exemplary embodiment of the inventive concept, is not related to formats of source ROM codes. That is, the method according to an exemplary embodiment of the inventive concept includes an operation of converting source ROM codes having various formats into source ROM codes having a particular format, and thus the source ROM codes having a unified format may be used.

Figure 10:
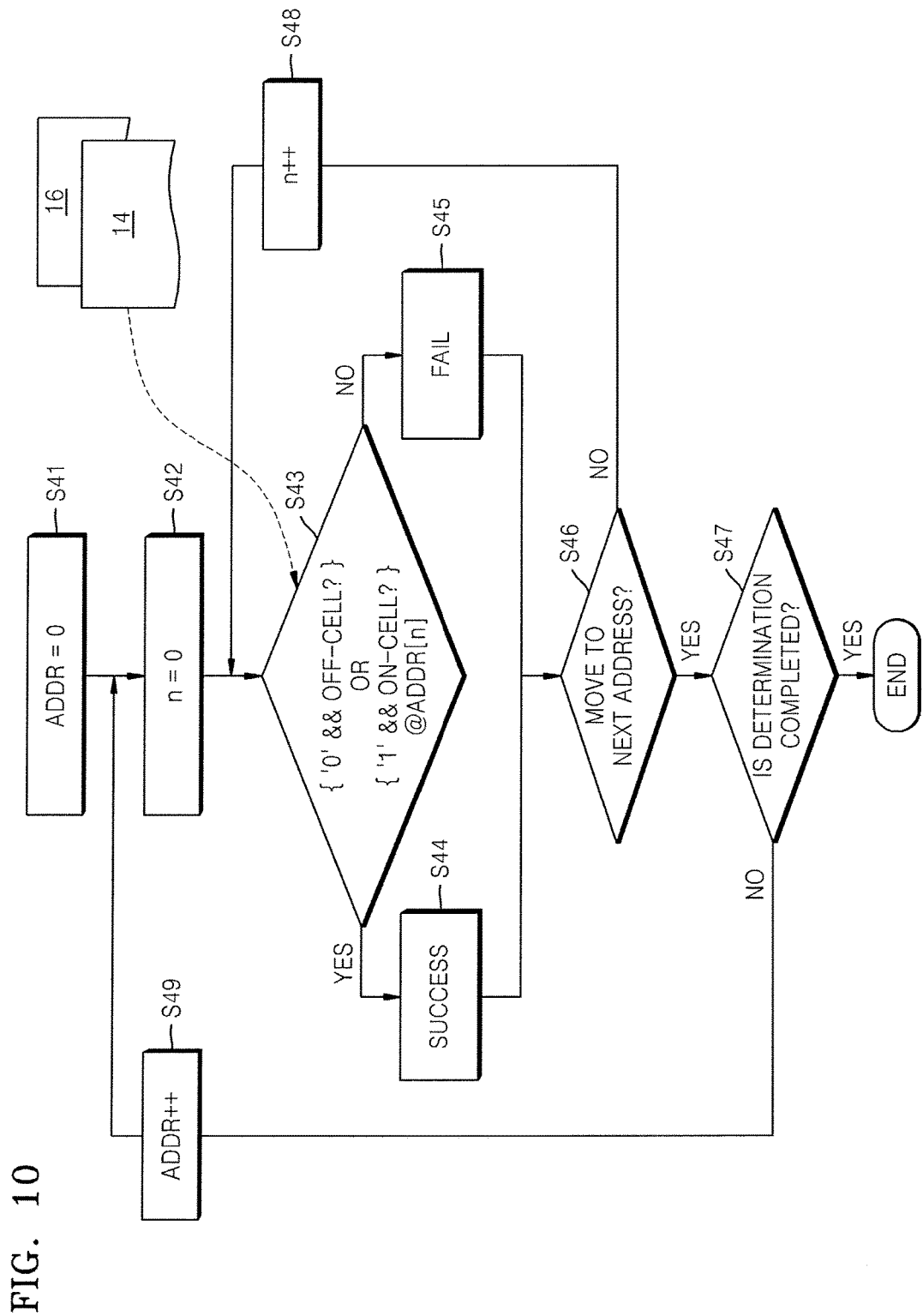
FIGS. 10 and 11 are flowcharts of an operation of determining an error cell of FIG. 1, according to an exemplary embodiment of the inventive concept.
Figure 11:
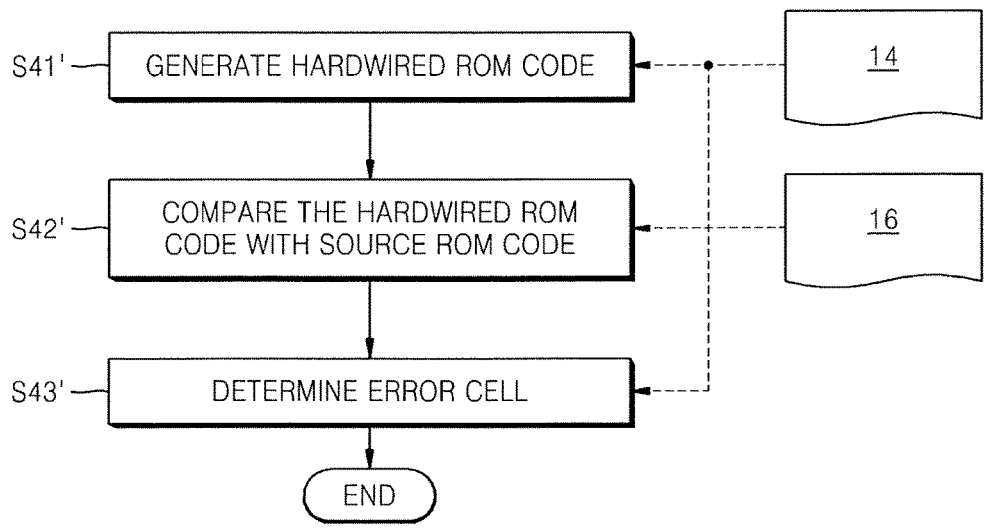

FIGS. 10 and 11 are flowcharts of an operation of determining an error cell of FIG. 1, according to exemplary embodiments of the inventive concept. Dashed arrows of FIGS. 10 and 11 indicate that the bitmap data 14 and the source ROM code 16 that are received in operation S00 of FIG. 1 are used in operations indicated by the dashed arrows. It will be understood that the flowcharts of FIGS. 10 and 11 are conceptually illustrated for understanding of the inventive concept, and the inventive concept is not limited thereto.

As shown in FIG. 10, the operation of determining an error cell includes an initialization operation (operations S41 and S42). That is, a variable "ADDR" indicating an address is initialized (operation S41), and a variable "n" indicating a bit location is initialized (operation S42). Thereafter, whether a cell is the error cell is determined based on coordinate data of a bit determining unit, the bitmap data 14, and the source ROM code 16 (operation S43). Referring to FIG. 1, the coordinate data of the bit determining unit may be generated based on layout design data in operation S20. As shown in FIG. 7, whether the cell is an on-cell or an off-cell is determined based on the coordinate data of the bit determining unit and the bitmap data 14. Thus, as shown in FIG. 10, when a bit having a bit location "n" in data of "ADDR" is "0", and cells corresponding to "ADDR" and "n" are off-cells in the source ROM code 16, the cells are determined to be a success (that is, the cells are determined as normal cells) (operation S44). When a bit having the bit location "n" in the data of "ADDR" is "1", and the cells corresponding to "ADDR" and "n" are on-cells in the source ROM code 16, the cells are determined to be a success (that is, the cells are determined as normal cells) (operation S44). When a bit is "0" and a cell is the on-cell, or a bit is "1" and a cell is the off-cell, the cell is determined to be a fail (that is, the cell is determined as an error cell) (operation S45).

Thereafter, the operation of determining an error cell is performed by moving to a next address (operation S46). For example, whether the operation of determining an error cell is performed by moving to the next address or not may be determined according to a result of the comparison between the variable "n" and a data width. When the determination indicates not moving to the next address, the variable "n" increases (operation S48), and whether a cell is the error cell may be determined (operation S43). When the determination indicates moving to the next address, whether the operation of determining the error cell is completed is determined (operation S47). For example, if the variable "ADDR" is identical to a last address of source ROM code, the operation of determining the error cell may be determined as completed, and the operation of determining an error cell may end. Otherwise, if the variable "ADDR" is not identical to the last address of the source ROM code, the variable "ADDR" increases (operation S49), and whether the cell is the error cell is determined (operation S43).

FIG. 11 is the flowchart of the operation of determining an error cell of FIG. 1, according to an exemplary embodiment of the inventive concept. As shown in FIG. 11, hardwired ROM code is generated based on the coordinate data of the bit determining unit and the bitmap data 14 (operation S41'). The hardwired ROM code may refer to ROM code corresponding to a layout of a cell array. When the hardwired ROM code and the source ROM code are identical, it may be determined that the cell array does not include the error cell.

As described with reference to FIG. 7, whether a cell includes the bit determining unit may be determined based on the coordinate data of the bit determining unit and the bitmap data 14. Data stored in the cell may be mapped to "0" or "1" according to whether the cell includes the bit determining unit, and "0" or "1" mapped to an address may be recorded based on the bitmap data 14, and thus the hardwired ROM code may be generated. The hardwired ROM code may be used to perform the method of verifying a layout of the mask ROM and may have another use. For example, information regarding a corrected part may be obtained by comparing the hardwired ROM code with source ROM code that is newly programmed into the mask ROM.

After the hardwired ROM code is generated, the hardwired ROM code and the source ROM code 16 are compared (operation S42'). According to a result of the comparison between the hardwired ROM code and the source ROM code 16, an error bit may be detected from the hardwired ROM code, and an address and a location of the error bit may be determined. A cell corresponding to the address and the location of the error bit may be determined as the error cell based on the bitmap data 14 including an address and location data of the cell (operation S43').

Figure 12:
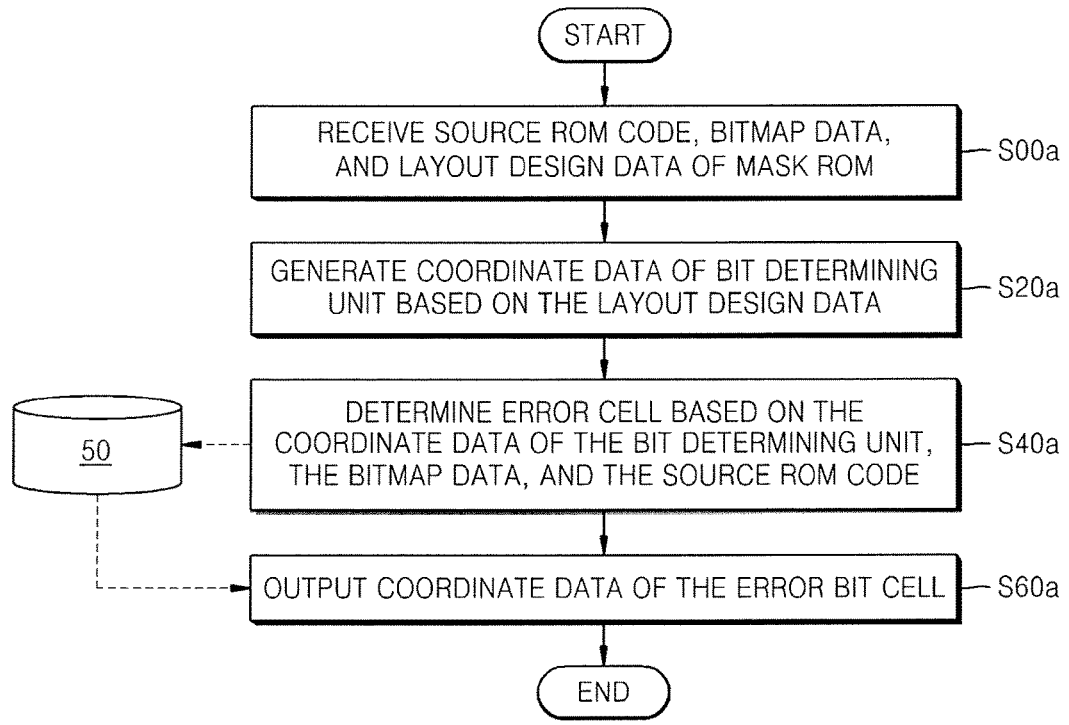
FIG. 12 is a flowchart of a method of verifying a layout of a mask ROM, according to another exemplary embodiment of the inventive concept.

FIG. 12 is a flowchart of a method of verifying a layout of a mask ROM, according to an exemplary embodiment of the inventive concept. Compared to the method of FIG. 1, the method of FIG. 12 further includes accessing a storage device 50 and outputting coordinate data of an error cell (S60a). As shown in FIG. 12, the method of verifying the layout of the mask ROM, according to an exemplary embodiment of the inventive concept, includes operation S00a of receiving source ROM code, bitmap data, and layout design data and operation S20a of generating coordinate data of a bit determining unit based on the layout design data.

Thereafter, the error cell is determined based on the coordinate data of the bit determining unit, the bitmap data, and the layout design data (S40a). For example, the error cell may be determined according to the embodiments of FIGS. 10 and 11. According to an exemplary embodiment of the inventive concept, coordinate data of the determined error cell may be recorded in the storage device 50. Thereafter, the coordinate data of the error cell stored in the storage device 50 is output (S60a). For example, a file including the coordinate data of the error cell may be generated or the coordinate data of the error cell may be displayed to a user on a display device. In addition, based on the coordinate data of the error cell stored in the storage device 50, the error cell may be geometrically displayed in an environment in which the layout design data of the mask ROM is geometrically displayed.

According to an exemplary embodiment of the inventive concept, the layout design data may be automatically corrected. That is, based on a type of the bit determining unit (e.g., is it an on-cell or an off-cell) and the coordinate data of the error cell, a part of at least one layer relating to the bit determining unit corresponding to a coordinate of the error cell may be corrected, and thus the layout design data may be automatically corrected in accordance with the source ROM code. For example, the via VIA may be added to the error cell, the via VIA included in the error cell may be removed, or the via VIA disposed in the error cell may be moved, and thus the layout design data may be automatically corrected in accordance with the source ROM code. For example, referring to FIG. 3, if it is determined that cell 110 should have been an off-cell the via of cell 110 is removed, and if it is determined that cell 120 should have been an on-cell a via is added to cell 120. For example, referring to FIG. 4, if it is determined that cell 130 should have been an on-cell, one of the vias is moved to connect to the bit line BL, and if it is determined that cell 140 should have been an off-cell one of the vias is moved so that both vias connect to the ground line GND or both vias connect to the bit line BL.

According to an exemplary embodiment of the inventive concept, a method of verifying a layout of a mask ROM is provided. The method includes identifying a cell within layout design data of the mask ROM from coordinate data within bitmap data of the mask ROM.

For example, referring to FIG. 3, cell 110 can be identified within the layout design data when the location of cell 110 within the layout design data corresponds with the location of a bit within bitmap data of the mask ROM. For example, referring to FIG. 6 and the design layout data of FIG. 3, if the location of bit[0] at address "00002" of 1.24, 9.76 matches with the location of cell 110 with the layout design data, then cell 110 would be the identified cell, and if the location of bit[2] at address "0002" of 24.39, 9.76 matches with the location of cell 120 within the layout design data, then cell 120 would be identified. The locations compared need not be identical for a match to be present. For example, if the locations are within a certain threshold, they may be deemed a match.

The method next includes determining whether a current type of the identified cell is an on-cell or an off-cell. For example, if cell 110 is the identified cell, then cell 110 would be determined to be an on-cell since it includes a via in the layout design data. For example, if cell 120 is the identified cell, then cell 120 would be determined to be the off-cell since it does not include a via in the layout design data.

The method next includes determining from ROM source code for the mask ROM whether an intended type of the identified cell is an on-cell or an off-cell, and determining the identified cell to have an error if the current type does not match the intended type. For example, if the identified cell is cell 110, and its current type was determined to be an on-cell, but it is determined from the ROM source code that cell 110 is supposed to be an off-cell, the method concludes that the identified cell has an error. The method may further include correct the cell by adding a via, removing a via, or moving a via of the cell within the design layout data. For example, if cell 110 is supposed to be an off-cell, the method could remove the via of cell 110 from the layout design data.

Figure 13:
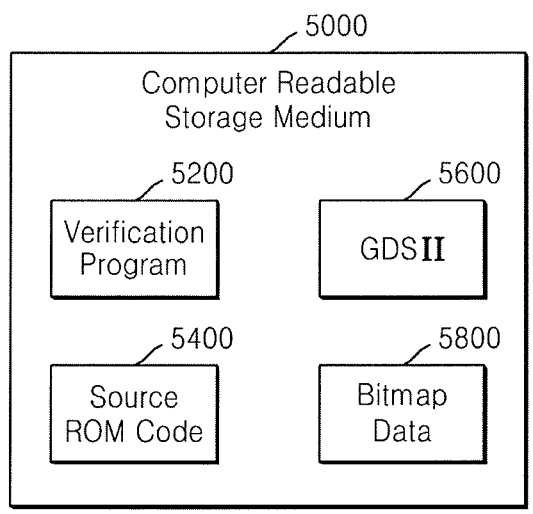
FIG. 13 is a block diagram of a computer-readable storage medium according to an exemplary embodiment of the inventive concept.

FIG. 13 is a block diagram of a computer-readable storage medium 5000 according to an exemplary embodiment of the inventive concept. The computer-readable storage medium 5000 may include an arbitrary storage medium, which may be read by a computer while being used to provide commands and/or data to a computer. For example, the computer-readable storage medium 5000 may include magnetic or optical media (e.g., discs, tapes, CD-ROMs, DVD-ROMs, CD-Rs, CD-RWs, DVD-Rs, DVD-RWs, etc.), volatile or non-volatile memories (e.g., RAMs, ROMs, flash memories, etc.), and micro-electromechanical systems (MEMS). The computer-readable storage medium 5000 may be inserted into a computer, integrated into a computer, or combined with a computer through a network and/or a communication medium, such as a wireless link.

As shown in FIG. 13, the computer-readable storage medium 5000 may include a verification program 5200, layout design data such as GDSII 5600, source ROM code 5400, and bitmap data 5800. The verification program 5200 may include commands used to perform the method of verifying a layout of a mask ROM described above. For example, the computer-readable storage medium 5000 may store arbitrary commands used to wholly or partially implement the flowcharts of the methods shown in at least one of FIGS. 1 and 10 through 12.

The GDSII 5600 is layout design data that may include information indicating sizes and locations of objects on a substrate. The source ROM code 5400 may include data that is to be programmed into the mask ROM and may be provided by a customer who is to receive the mask ROM. The bitmap data 5800 may include coordinate data of a cell corresponding to an address input to the mask ROM.

Although not shown in FIG. 13, the computer-readable storage medium 5000 may further store data produced during a process of verifying the layout of the mask ROM. For example, the computer-readable storage medium 5000 may store coordinate data of a bit determining unit from the layout design data or hardwired ROM code produced based on the layout design data and bitmap data.

Figure 14:
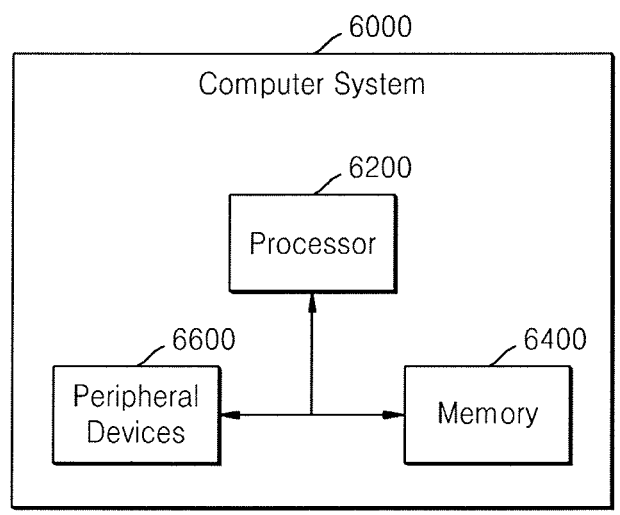
FIG. 14 is a block diagram of a computer system according to an exemplary embodiment of the inventive concept.

FIG. 14 is a block diagram of a computer system 6000 according to an exemplary embodiment of the inventive concept. As shown in FIG. 14, the computer system 6000 may include a processor 6200, a memory 6400, and various peripheral devices 6600. The processor 6200 may be connected to the memory 6400 and the peripheral devices 6600.

The processor 6200 may be configured to execute commands for performing the above-described method. According to an exemplary embodiment of the inventive concept, the processor 6200 may execute arbitrary command sets (e.g., Intel Architecture-32 (IA-32), 64-bit extension IA-32, x86-64, PowerPC, Sparc, MIPS, ARM, IA-64, etc.). The computer system 6000 may also include at least one processor.

The processor 6200 may be connected to the memory 6400 and the peripheral devices 6600 in an arbitrary manner. For example, the processor 6200 may be connected to the memory 6400 and/or the peripheral devices 6600 via various interconnections. In addition, one or more bridge chips may be used to couple the processor 6200, the memory 6400, and the peripheral devices 6600 creating multiple connections between these components.

The memory 6400 may include a memory system of an arbitrary type. For example, the memory 6400 may include dynamic random access memory (DRAM), double data rate synchronous DRAM (DDR SDRAM), or Rambus DRAM (RDRAM). A memory controller may be included to interface with the memory 6400, and/or the processor 6200 may include the memory controller. The memory 6400 may store commands for performing the above-described simulation method and data processed by the processor 6200.

The peripheral devices 6600 may include an input device for receiving data from a user and an output device for presenting simulation result data to the user. The peripheral devices 6600 may also include hardware devices of arbitrary types, which may be included in or combined with the computer system 6000, for example, storage devices or input/output (I/O) devices, such as video hardware, audio hardware, user interface devices, and network hardware.

While the inventive concept has been particularly shown and described with reference to exemplary embodiments thereof, it will be understood that various changes in form and details may be made therein without departing from the spirit and scope of the disclosure.

What is claimed is:

1. A computer-implemented method of correcting a layout of a mask read only memory (ROM), the method comprising:
   a processor receiving source ROM code, bitmap data, and layout design data of the mask ROM;
   the processor generating coordinate data of vias of the layout design data;
   the processor determining an error cell in the layout design data based on the coordinate data of the vias, the bitmap data, and the source ROM code; and
   the processor correcting the layout design data using the determined error cell,
   wherein each via is used to connect a transistor of the mask ROM to a bit line in the mask ROM, and
   wherein the determining comprises the processor determining a given cell of the mask ROM to be the error cell when a bit, the source ROM code for the given cell is 1 and two of the vias are adjacent in a same direction in the given cell.

2. The method of claim 1, wherein the generating of the coordinate data of the vias comprises: extracting geometric data with respect to at least one layer relating to the vias from the layout design data.

3. The method of claim 2, wherein the generating of the coordinate data of the vias comprises:

determining an area of a cell array based on the bitmap data; and generating the coordinate data for a corresponding one of the vias included in the area of the cell array.

4. The method of claim 2, wherein the extracting of the geometric data with respect to the at least one layer comprises:

receiving a design rule file generated such that design rule check (DRC) result data includes the geometric data with respect to the at least one layer; and providing the design rule file to an input of the DRC.

5. The method of claim 1, further comprising: outputting coordinate data of the error cell according to a result of the determining of the error cell.

6. The method of claim 1, wherein the bitmap data comprises coordinate data of a cell and address information corresponding to the cells.

7. The method of claim 1, wherein the layout design data has a graphic data system II (GDSII) format.

8. A non-transitory computer-readable recording medium having recorded thereon a computer program for executing the method of claim 1.

9. A computer-implemented method of correcting a layout of a mask read only memory(ROM), the method comprising:

a processor receiving source ROM code, bitmap data, and layout design data of the mask ROM;

the processor generating coordinate data of vias of the layout design data;

the processor determining an error cell in the layout design data based on the coordinate data of the vias, the bitmap data, and the source ROM code; and the processor correcting the layout design data using the determined error cell, wherein each via is used to connect a transistor of the mask ROM to a bit line in the mask ROM, and wherein the determining comprises the processor determining a given cell of the mask ROM to be the error cell when a hit of the source ROM code for the given cell is 0 and the given cell does not include two of the vias adjacent in a same direction.

10. A non-transitory computer-readable recording medium having recorded thereon a computer program for executing the method of claim 9.

* * * * *